(12) United States Patent
Buras

(10) Patent No.: US 10,371,744 B2
(45) Date of Patent: Aug. 6, 2019

(54) METHOD AND APPARATUS FOR AN EFFICIENT FRAMEWORK FOR TESTCELL DEVELOPMENT

(71) Applicant: Advantest Corporation, Tokyo (JP)

(72) Inventor: Brian Buras, Austin, TX (US)

(73) Assignee: ADVANTEST CORPORATION, Tokyo (JP)

( * ) Notice: Subject to any disclaimer, the term of this patent is extended or adjusted under 35 U.S.C. 154(b) by 272 days.

(21) Appl. No.: 14/635,225

(22) Filed: Mar. 2, 2015

(65) Prior Publication Data

US 2015/0177316 A1 Jun. 25, 2015

Related U.S. Application Data

(63) Continuation-in-part of application No. 13/444,705, filed on Apr. 11, 2012, now Pat. No. 9,448,276.

(51) Int. Cl.
*G01R 31/28* (2006.01)

(52) U.S. Cl.
CPC ...... *G01R 31/2834* (2013.01); *G01R 31/2894* (2013.01)

(58) Field of Classification Search
CPC .............. G01R 31/2894; G01R 31/2834
USPC ...................................... 717/124
See application file for complete search history.

(56) References Cited

U.S. PATENT DOCUMENTS

| 5,359,648 A | 10/1994 | Dunn et al. |
| 6,636,872 B1 * | 10/2003 | Heath ............... G06F 17/30194 |
| 6,842,891 B2 * | 1/2005 | Zhang .................. G06F 9/5055 717/101 |
| 7,254,806 B1 | 8/2007 | Yates, Jr. et al. |

(Continued)

FOREIGN PATENT DOCUMENTS

EP 0397937 11/1990

OTHER PUBLICATIONS

"Braha et al., On the Use of Decision Tree Induction for Discovery of Interactions in a Photolithographic Process, IEEETransactions on Semiconductor Manufacturing, vol. 16, No. 4, pp. 644-652, Nov. 2003.".

(Continued)

*Primary Examiner* — John Q Chavis

(57) ABSTRACT

A method of performing a test using automated test equipment (ATE) is disclosed. The method comprises configuring a proxy application programming interface (API) services module, wherein the proxy API services module provides an interface between a test framework and a test software environment, wherein the test framework communicates with the test software environment though the proxy API services module, wherein the test software environment is communicatively coupled with test hardware, and wherein the proxy API services module is configured to isolate the test framework from dependencies associated with the test software environment. The method further comprises communicating commands synchronously between the test framework and the test software environment, wherein the test framework comprises a plurality of components, and wherein the plurality of components is operable to receive commands from the test software environment and further operable to transmit commands to the test software environment through the proxy API services module.

20 Claims, 8 Drawing Sheets

(56) References Cited

U.S. PATENT DOCUMENTS

| | | | |
|---|---|---|---|
| 7,373,632 B1* | 5/2008 | Kawaguchi | G06F 9/465 709/203 |
| 7,383,147 B2 | 6/2008 | Dorough et al. | |
| 7,958,518 B1* | 6/2011 | Willeford | G06F 9/54 717/124 |
| 7,971,090 B2* | 6/2011 | Nan | G06F 11/3696 709/202 |
| 7,991,602 B2* | 8/2011 | Maturana | G05B 17/02 700/275 |
| 8,442,067 B2 | 5/2013 | Bryan et al. | |
| 9,322,874 B2 | 4/2016 | Arnold et al. | |
| 9,448,276 B2 | 9/2016 | Arnold et al. | |
| 2002/0155628 A1 | 10/2002 | Bulaga et al. | |
| 2003/0014205 A1 | 1/2003 | Tabor | |
| 2006/0047705 A1 | 3/2006 | Reade et al. | |
| 2006/0064399 A1* | 3/2006 | De Sio | G06F 17/3089 |
| 2006/0129499 A1* | 6/2006 | Combar | G06F 17/30893 705/64 |
| 2006/0150018 A1 | 7/2006 | Cousin et al. | |
| 2006/0212253 A1 | 9/2006 | Velichko et al. | |
| 2007/0079291 A1* | 4/2007 | Roth | G06F 11/3668 717/124 |
| 2007/0152695 A1 | 7/2007 | Bosy et al. | |
| 2007/0198445 A1 | 8/2007 | Zen | |
| 2007/0203973 A1* | 8/2007 | Landauer | H04L 12/2697 709/203 |
| 2008/0120602 A1* | 5/2008 | Comstock | G06F 11/3688 717/125 |
| 2008/0281566 A1 | 11/2008 | Wang et al. | |
| 2009/0138956 A1* | 5/2009 | Schneider | H04L 67/327 726/12 |
| 2009/0193294 A1 | 7/2009 | Nakamura et al. | |
| 2010/0023294 A1 | 1/2010 | Fan et al. | |
| 2012/0174068 A1* | 7/2012 | Gutfleisch | G06F 11/3696 717/124 |
| 2013/0027535 A1 | 1/2013 | Rekimoto et al. | |
| 2013/0046878 A1* | 2/2013 | Fryc | G06F 11/3672 709/224 |
| 2015/0135158 A1* | 5/2015 | Tenev | G06F 11/3684 717/101 |
| 2016/0085610 A1* | 3/2016 | McFate | G06F 9/5027 714/33 |

OTHER PUBLICATIONS

Irani et al., Applying Machine Learning to Semiconductor Manufacturing, IEEE Expert., vol. 8, Issue 1, Feb. 1993.

Guh et al., An Effective Application of Decision Tree Learning for On-line Detection of Mean Shifts in Multivariate control Charts, Computers & Industrial Engineering, vol. 55, pp. 475-493, 2008.

Sun et al., Decision Tree and PCA-based Fault Diagnosis of Rotating Machinery, Mechanical Systems and Signal Processing, vol. 21, pp. 1300-1317, 2007.

"Yang et al., Vibex: An Expert System for Vibration Fault Diagnosis of Rotating Machinery Using Decision Tree and DecisionTable, Expert Systems with Applications, vol. 28, pp. 735-742, 2005".

"Kang et al., Virtual Metrology for Run-to-Run Control in Semiconductor Manufacturing, Expert Systems with Applications, vol. 38, pp. 2508-2522, Mar. 2011".

* cited by examiner

METHOD AND APPARATUS FOR AN EFFICIENT FRAMEWORK FOR TESTCELL DEVELOPMENT

CROSS REFERENCE TO RELATED APPLICATIONS

This application claims priority from and is a continuation-in-part of co-pending U.S. patent application Ser. No. 13/444,705, "Creation and Scheduling of a Decision and Execution Tree of a Test Cell Controller,", Henry Arnold, filed Apr. 11, 2012, the entire disclosure of which is incorporated herein by reference.

TECHNICAL FIELD

The present disclosure relates generally to the field of automated test equipment and more specifically to the field of process control of automated test equipment.

BACKGROUND

Automated test equipment (ATE) can be any testing assembly that performs a test on a device, semiconductor wafer or die, etc. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing.

The test results that are provided from an ATE assembly may then be analyzed to evaluate electronic components being tested. Such test result evaluations may be, for example, a part of a statistical process control method. In one exemplary embodiment, process control methods may be used to monitor and control a manufacturing process to ensure that the manufacturing process is producing the desired product, e.g., semiconductor devices at a desired level of efficiency and at a desired level of quality. Changes to the manufacturing process and/or test process may then be implemented in follow-on production runs based upon the analysis of the test results.

Prior methods of developing the applications and/or process control methods to program ATE assemblies have been inefficient because the interfaces to configure the process control methods have been tightly coupled to the manufacturing process. For example, different released versions of the test software implementing the process control methods were compatible with different manufacturing processes. The developer was therefore faced with supporting a wide range of test software versions without the help of integrated development tools. Further, these dependencies hindered the integration of existing customer frameworks.

As a result, field engineers had to customize the test software separately for each manufacturing process and each respective client. Also, the clients would further customize the test software to suit their test own testing needs. The man-hours spent in the customization process resulted in considerable inefficiencies in the field. Additionally, the various versions of the test software made providing support to the customers difficult and inefficient for the field engineers and manufacturers of test equipment.

Prior developers of ATE hardware and software have attempted to decouple interfaces from manufacturing processes with limited success. Attempts to decouple the interfaces have incurred a cost of complexity that limits usability and acceptance. Further, prior solutions have incurred run time costs that are a critical disadvantage during the test cycle.

SUMMARY OF THE INVENTION

Embodiments of this present invention provides solutions to the challenges inherent in implementing applications and process control methods in automated testing. In particular, embodiments of this invention provide a test framework comprising a component system that is efficient and performance oriented and minimizes dependencies. By minimizing dependencies, it significantly improves the efficiency of production application development. The test framework of the present invention also provides an abstraction layer over inconsistent and/or complex underlying interfaces, which allows it to deploy applications over a wide range of test software and product versions. Accordingly, the test framework of the present invention allows test process control methods or applications to be easily integrated into different versions and revisions of the test software.

Further, the framework of the present invention makes the interfaces and communications between the components more straightforward and efficient, which allows for rapid prototyping and development. In addition, embodiments of the present invention provides lifecycle management of all components and applications within the framework. Furthermore, the test framework allows software component interfaces to be decoupled and for the components to communicate with each other efficiently and with near zero latency. Embodiments of the present invention, therefore, advantageously minimizes dependencies, which results in lower complexity for field application engineers.

In one embodiment, a method of performing a test using automated test equipment (ATE) is disclosed. The method comprises configuring a proxy application programming interface (API) services module, wherein the proxy API services module provides an interface between a test framework and a test software environment, wherein the test framework communicates with the test software environment though the proxy API services module, wherein the test software environment is communicatively coupled with test hardware, and wherein the proxy API services module is further configured to isolate the test framework from dependencies associated with the test software environment. The method further comprises communicating commands synchronously between the test framework and the test software environment, wherein the test framework comprises a plurality of components that is operable to receive commands from the test software environment and further operable to transmit commands to the test software environment through the proxy API services module.

In another embodiment, an apparatus for testing a device is disclosed. The apparatus comprises a test framework comprising a plurality of components, wherein each component is a process and wherein a respective lifecycle of each component is determined by the test framework. The apparatus also comprises a proxy application programming interface (API) service module operable to provide an interface between the test framework and a test software environment, wherein the test framework communicates with the test software environment though the proxy API services module, wherein the test software environment is communicatively coupled with test hardware, and wherein further the proxy API services module is configured to isolate the test framework from dependencies associated with the test software environment. Further, the proxy API service module is further operable to communicate commands synchronously between the test framework and the test software environment, wherein the plurality of components is operable to receive commands from the test software environment and further operable to transmit commands to the test software environment through the proxy API services module.

In a different embodiment, a computer-readable medium having computer-readable program code embodied therein for causing a computer system to perform a method of configuring a test using automated test equipment (ATE) is disclosed. The method comprises configuring a proxy application programming interface (API) services module, wherein the proxy API services module provides an interface between a test framework and a test software environment, wherein the test framework communicates with the test software environment though the proxy API services module, wherein the test software environment is communicatively coupled with test hardware, and wherein the proxy API services module is further configured to isolate the test framework from dependencies associated with the test software environment. The method further comprises communicating commands synchronously between the test framework and the test software environment, wherein the test framework comprises a plurality of components that is operable to receive commands from the test software environment and further operable to transmit commands to the test software environment through the proxy API services module.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

Figure 1:
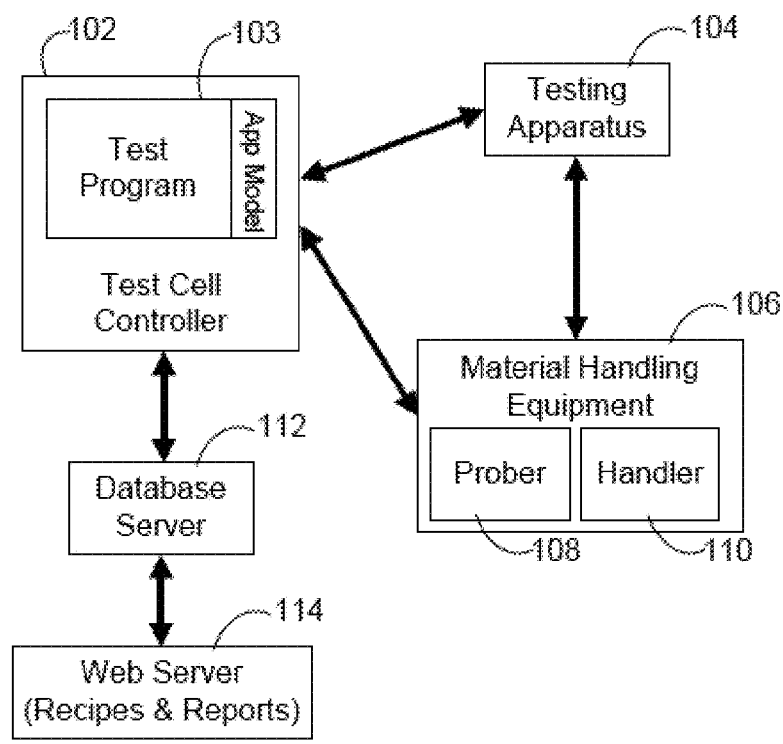
FIG. 1 illustrates an exemplary high level block diagram of an automated test equipment (ATE) implementing process controls using a test framework in accordance with an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "configuring," "communicating," "distributing," or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Embodiments of this present invention provide a solution to the challenges inherent in implementing process control methods in automated testing. In particular, embodiments of this invention provide a test framework comprising a component system that is efficient and performance oriented and minimizes dependencies. The test framework of the present invention provides an abstraction layer over inconsistent and/or complex underlying interfaces, which allows it to deploy applications over a wide range of test software and product versions. Accordingly, the test framework of the present invention allows test process control methods or applications to be easily integrated into different versions and revisions of the test software.

Further, the framework of the present invention makes the interfaces and communications between the components more straightforward and efficient, which allows for rapid prototyping and development. In addition, the test framework of the present invention provides lifecycle management of all components and applications within the framework. Furthermore, the test framework allows software component interfaces to be decoupled and for the components to communicate with each other efficiently and with near zero latency. The framework of the present invention, therefore, advantageously minimizes dependencies, which results in lower complexity for field application engineers.

In one embodiment, the test cell framework (hereinafter referred to as the "VTC framework") provides an efficient and dynamic component system for distribution of test cell events, an interface for inter-component communication, and automatic event-based execution of user shell scripts. The user components can access all the smart test interfaces for any smart test release with no build dependencies on any special software libraries.

As discussed above, prior methods of integrating tester hardware and software into the local manufacturing environment for both monitoring and control can be a tedious one. The traditional methods involve many engineering hours of effort and significant amounts of customization to create a specific solution for each environment. The VTC framework of the present invention provides a common foundation from which to integrate into modern manufacturing environments with considerably less time and effort.

FIG. 1 illustrates an exemplary high level block diagram of an automated test equipment (ATE) implementing process controls using a test framework in accordance with an embodiment of the present invention. As illustrated in FIG. 1, an exemplary automated test equipment 100 embodiment with integrated process control comprises: a test cell controller 102, a testing apparatus 104, material handling equipment 106, a database server 112, and a web server 114 (e.g. containing control rule recipes and reports). The automated test equipment 100 may, for example, provide real-time analysis of test results and an insertion of prober or handler commands that are transparent to a test program 103. In one exemplary embodiment, the material handling equipment 106 may comprise a prober 108 and a handler 110. In one exemplary embodiment, the prober 108 is a socket or probe card comprising a plurality of pins or needles that come in contact with a device-under-test (e.g., semiconductor wafer, die, etc.). As illustrated in FIG. 1, a test cell controller 102 may comprise a test program 103. The test program 103 may comprise an application model. In one embodiment, the test program 103 and the application model may be running within tester software, e.g., Advantest's SmarTest Software Suite. In one embodiment, test software, e.g. SmarTest allows process control methods and applications running on test controller 102 to communicate with testing apparatus 104 and/or material handling equipment 106. In one embodiment, the VTC framework of the present invention is also implemented on test cell controller 102.

The web server 110 may be used to enter process control rules, analyze results and monitor process. The web server 110 may also comprise a web-based editor for creating and editing process control rules. In exemplary embodiments the web server 110 may be a desktop computer with a web browser. The testing apparatus 104, in addition to testing, may capture test result values, bin counts, and various types of yield counts used to test process control rules. In one exemplary embodiment, a plurality of testing apparatuses 104 may be controlled by the test cell controller 102 and evaluated for process control. In one embodiment, test software running on test controller 102 is configured to control and communicate with testing apparatus 104.

Results of data collection (raw and statistical) and process control rules execution may be stored on the database server 112. The web server 114 may access these stored results, as well as other tools, as described in detail below. Data in this database 112 may be analyzed during process control rule evaluations. In one exemplary embodiment, as described in detail below, the test controller 114 and the test software, (e.g., SmarTest) running on it further comprises an analysis and process control framework that non-intrusively captures test results and tests the process control rules with minimum overhead and a small code footprint.

Figure 2:
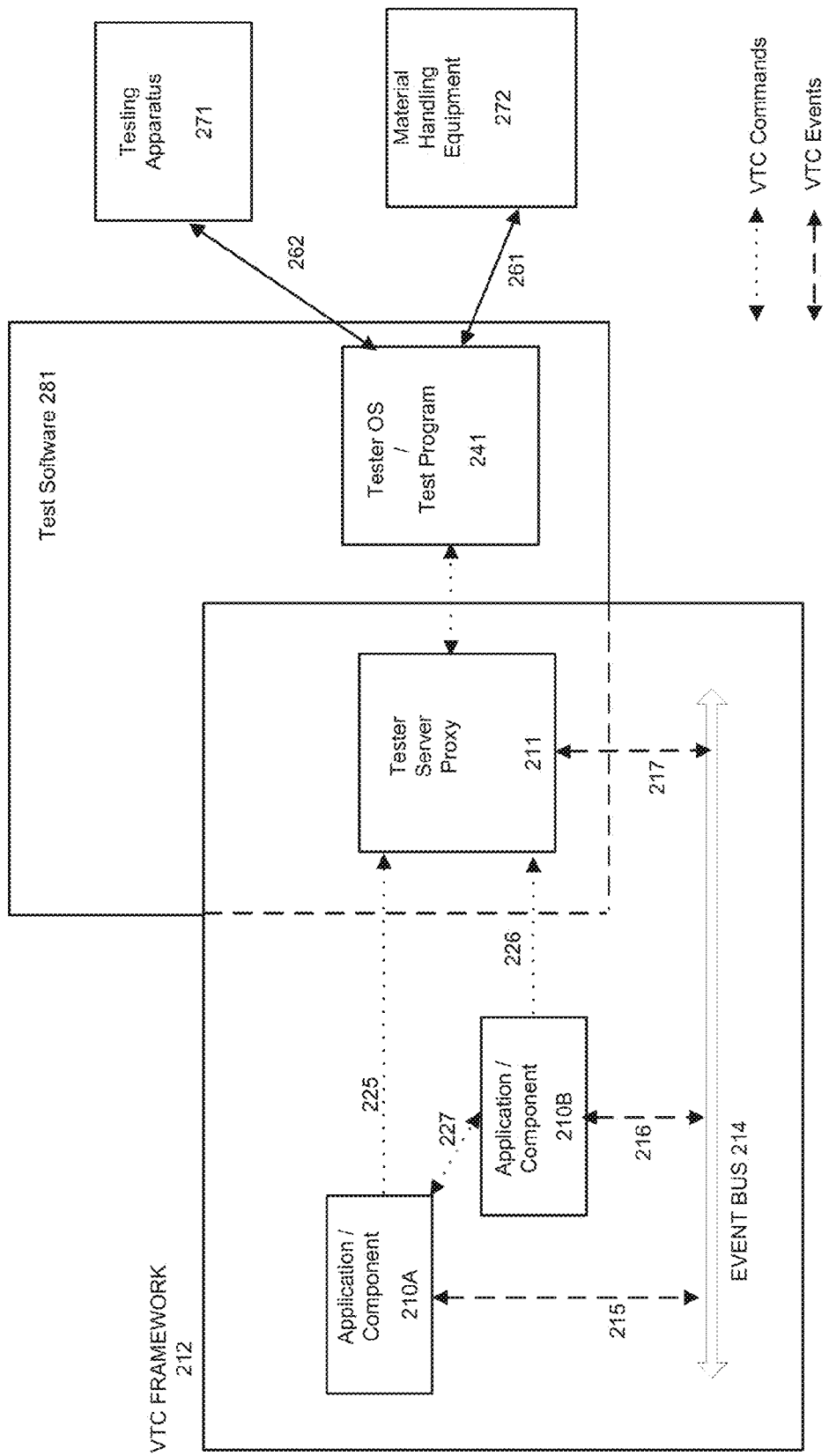
FIG. 2 is an exemplary simplified block diagram illustrating the manner in which the test cell framework (hereinafter referred to as "the VTC framework") interfaces with the test software and hardware in accordance with an embodiment of the present invention.

FIG. 2 is an exemplary simplified block diagram illustrating the manner in which the VTC framework interfaces with the test software and hardware in accordance with an embodiment of the present invention. As mentioned above, in a typical embodiment, the VTC framework 212 and test software 281 are both implemented on the test cell controller module 102. In one embodiment, the VTC framework 212 is designed to address the problems with integrating ATE assemblies into a high volume manufacturing (HVM) environment. The VTC framework 212 provides a layer of abstraction over the tester software 281, which allows it to operate over a wide range of test software versions. In one embodiment, the VTC framework communicates with the tester operating system (OS) and test program 241 running within test software 281 through the tester server proxy 211.

Prior versions of test software 281 comprised numerous application programming interfaces provided to monitor and automate many steps in the test process to reduce the amount of interactivity. However, the numerous interfaces were problematic because they did not provide an integrated development environment for application programming. Further, the interfaces contained complex dependencies and supported multiple platforms. In addition, the interfaces were based on programming languages such as C or C++ and any client application had to be compiled with platform specific options. Also, a binary needed to be built for each supported platform. These requirements meant that an application developer unfortunately needed to know enough about the platform to create the proper build configurations and to manage deployment across multiple platforms.

Embodiments of the present invention circumvent these limitations by providing a single tester server proxy module 211 as an interface for the applications developed by the application developers. In one embodiment, the tester server proxy module 211 provides a revision-independent interface to a test software session. In other words, proxy module 211 may, in one embodiment, provide isolation from the test platform specifics allowing applications and/or components, e.g., 210A and 210B to be created for the VTC framework 212 without needing to address test software version-related complexities. For example, if a test engineer needs to develop a wafer display application to monitor devices under test (DUTs) connected to testing apparatus 271 or material handling equipment 272, the VTC framework 212 of embodiments of the present invention allows him to develop an application that can run on any platform, any version and address any type of DUT. An application that provides a visual display of the wafers under test is not dependent on the test software 281 or test program 241 and, therefore, the VTC framework 212 provides the abstraction necessary so developers can avoid dealing with the complexities of the test software.

The tester proxy module 211, therefore, presents a common Application Programming Interface (API) for the VTC framework through which to interface with the test software 281. The proxy module 211 communicates with the various test software interfaces and forward commands from the component space in the VTC framework into the test software API space through the common API available to developers. This reduces the burden on the application developer because it obviates the need to manage deployment across multiple platforms. Further, it simplifies the build configurations and avoids incompatibility problems when integrated with existing customer applications.

The development and deployment process can be further simplified by allowing developers to use dynamic scripting languages to develop their applications, e.g., Java, Perl, Ruby or Python. This results in a significant improvement because the developer is no longer restricted to C or C++, which prior test software interfaces were based on. Dynamic scripting languages are advantageous for many reasons. For example, dynamic languages comprise comprehensive standard libraries, do not require a compilation step, are interactive, and do not need any complex type system or memory management.

Isolating a proxy module that contains the tight dependencies with the test equipment, e.g., testing apparatus 271 and material handling equipment 272, allows the test engineers to focus their efforts on keeping the proxy module updated and compatible with all the versions of the test software and equipment platforms. Meanwhile, it frees up the VTC framework 212 so that applications and other components can be developed for the framework without needing to address potential inconsistencies in hardware or software versions. In other words, the field application and test engineers integrating ATE assemblies into a new manufacturing environment are free to build applications without needing to consider different equipment hardware or software platforms and updates. Because the proxy module 211 contains all the dependencies, it allows test engineers to develop applications seamlessly and use the same component or application code for all other platforms as well.

As also shown in FIG. 2, in one embodiment, the applications or components, e.g., 210A and 210B may have the ability to exchange commands, e.g., 227 between each other. Further, commands can also be transmitted upstream through the server proxy module 211 to the test software 281 directly or to the connected hardware, e.g. apparatus 271 through test software 281. The commands are synchronous, so that when one command is initiated all other commands are blocked till the receiving application or component responds. Inter-component commands, in one embodiment, are implemented using architecture independent shared memory structures and common semaphore synchronization patterns (as will be further explained below). In one embodiment, components can communicate directly with each other instead of routing through a central service.

In one embodiment of the VTC framework, applications and components can also communicate with each other through events notifications. Events, e.g., 215, 216 and 217 are implemented using message queues and buffers (as will be further explained below). They are routed through a central dispatcher using event bus 214, which forwards the events to all the components. In contrast to commands, event notifications and distribution among components is asynchronous. In other words, a component may simply post an event to the event bus 214 without needing to wait for any other components. The events will then be distributed by the central dispatcher to the other components through event bus 214. The event notifications will be queued into the message queues for each respective component and get delivered after prior events in each respective queue have been transmitted.

One of the problems the VTC framework 212 overcomes is that of the test software 281 locking up the communication channels with the hardware, e.g. channels 262 and 261, so that only one process can communicate with the channels at any given time. In prior ATE assemblies, engineers working on factory integration for the test equipment would have to go through the test software interface in order to communicate with any connected equipment. This was problematic because the engineers would have to customize their applications and processes in order to interface with different versions of the test software. The tester server proxy module 211 of the present invention provides test engineers a consistent interface for designing their applications and processes.

Further, by providing a layer of abstraction over the test software 281, the VTC framework advantageously allows multiple applications, e.g., applications or components 225 and 226, to communicate with the test hardware, e.g., apparatus 271 or equipment 272 at the same time. Unlike prior version of the ATE, the applications and components running within VTC framework 212 do not need to wait for the test software to release the communication channels. Instead, a manager module (not shown) (hereinafter referred to as "VTC manager") within VTC framework 212 can serialize the multiple requests for tester proxy 211 to convey to the test software 281. This serialization occurs transparently so that the applications and components running within VTC framework do not need to be configured to handle any interference or dependency burdens on the existing infrastructure. Accordingly, the VTC framework of the present invention minimizes any dependencies on the test program 241 and test software 281.

The VTC manager within the VTC framework 212, in one embodiment, can also be configured to receive incoming alerts from the test equipment, e.g., 272 or 271. For example, if an operator starts a process on the test equipment on the manufacturing floor, the VTC manager can marshal alerts received from the test equipment (through the tester server proxy 211 interface) to the pertinent applications or components within VTC framework 212 to wake them up. This may be possible even if there is no test program 241 running on the test software 281. Event notifications can be sent by the VTC manager to the various applications and modules from the process running on the test equipment.

The VTC framework 212 of the present invention provides additional advantages to the ones discussed above. For example, the VTC framework can be configured to allow dynamic registration so that unknown components can participate. Further, it allows mixed 32 bit and 64 bit support. Finally, components within the VTC framework can start instantly while allowing large amounts of data to be transferred quickly.

Figure 3:
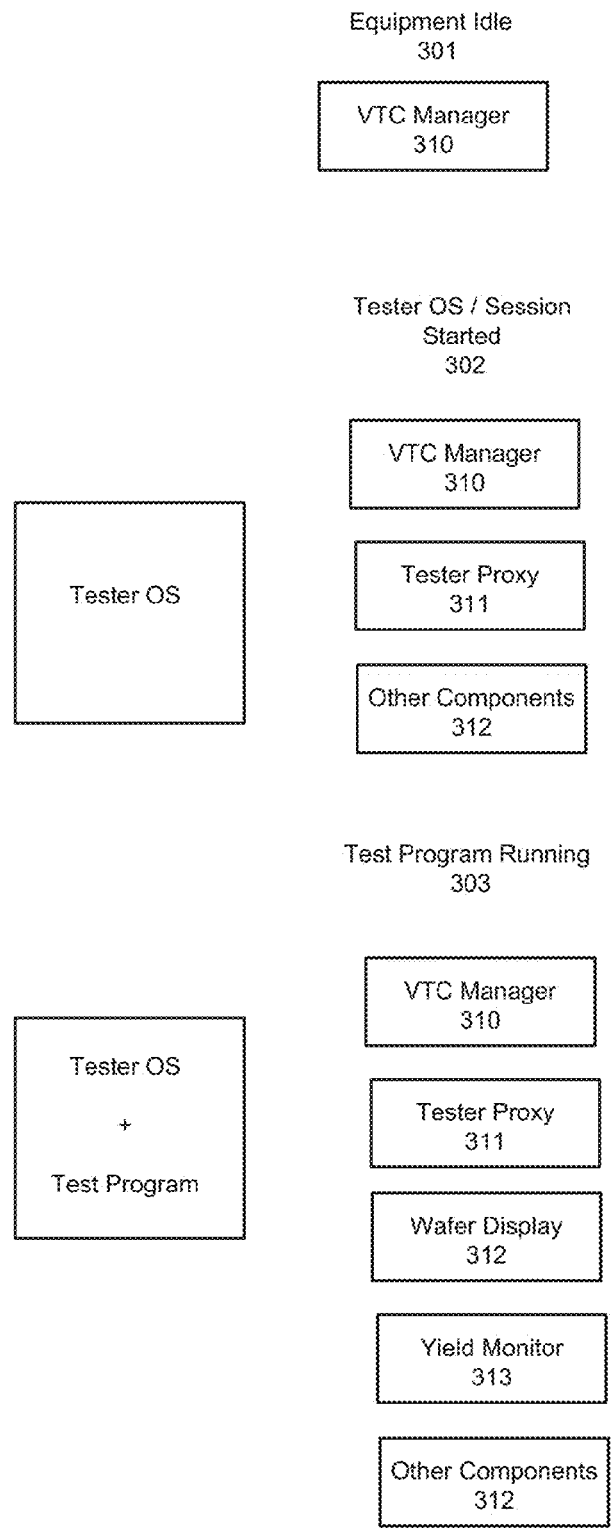
FIG. 3 illustrates the modules that are active in each stage of a test lifecycle in accordance with an embodiment of the present invention.

FIG. 3 illustrates the software modules that are active in each stage of a test lifecycle in accordance with an embodiment of the present invention. When the equipment is idle at stage 301 of the lifecycle, the only process that may be active, in one embodiment, is VTC manager 310. VTC manager 310 may, for example, be a root VTC component running on the host controller 102. The lifetime of the VTC manager may extend from host workstation boot until workstation shutdown.

In one embodiment, the VTC manager can be a daemon process. As a daemon process, it is independent of user login sessions, displays or terminals and can provide operations to meet any facility node interface requirements. It can also detect the existence of test software sessions 281 and any user processes that request to be part of the VTC environment. Further, in one embodiment, the VTC manager 310 generates event notifications based on detection of sessions and other resource availability.

At stage 302, if the tester OS is initiated, an event is generated and the VTC manager 301 detects this event. In one embodiment, every event generated by the platform or user components may be used to initiate execution of one or more shell scripts. In response to the OS initiation, for example, the VTC manager 310 may execute certain scripts. For example, tester proxy 311 needs to be initiated in response to the tester OS initiation, because tester proxy 311 provides the interface that allows the VTC framework to bind to the tester OS.

By way of further example, other components, e.g., 312 that are tied to the tester OS initiation may also be initiated at this stage. One example of such a component is "vtcshell," which is a Python shell that can operate as a VTC framework component. The vtcshell component can provide an interactive debug shell for integration applications. It also operates as an interpreter for user scripts that are to be run as components. In one embodiment, a process that is a VTC framework component can have its lifecycle managed automatically by the VTC manager 301, can receive all VTC framework event notifications through VTC manager 301 and can easily communicate with other component processes using a synchronous command interface.

At stage 303, when a test program is running and parts are being tested, the tester server proxy 311 detects events being generated, e.g., events generated because of a change in the state of material handling equipment 272. The tester server proxy 311 posts these events to the VTC framework 212. As mentioned above, each event may be associated with a script that may be executed on the launch of the event. For example, scripts may be initiated to launch wafer display application 312, yield monitor application 313 or other components 312. Some examples of other components 312 that may be running are statistical process controls, processes that monitor site-to-site differences, etc.

In one embodiment, any process that is a VTC framework component launched during test program execution can have its lifecycle managed automatically using VTC manager 310. Indeed, one of the advantages of the VTC framework of the present invention is that it is able to manage the lifecycle of its components by performing all the lifetime management activities that were previously delegated to the test software.

Further, in one embodiment, a component, e.g., wafer display 312 can receive all VTC event notifications through the event bus 214. Additionally, each VTC component can communicate with other VTC component processes via a synchronous command interface.

Figure 4:
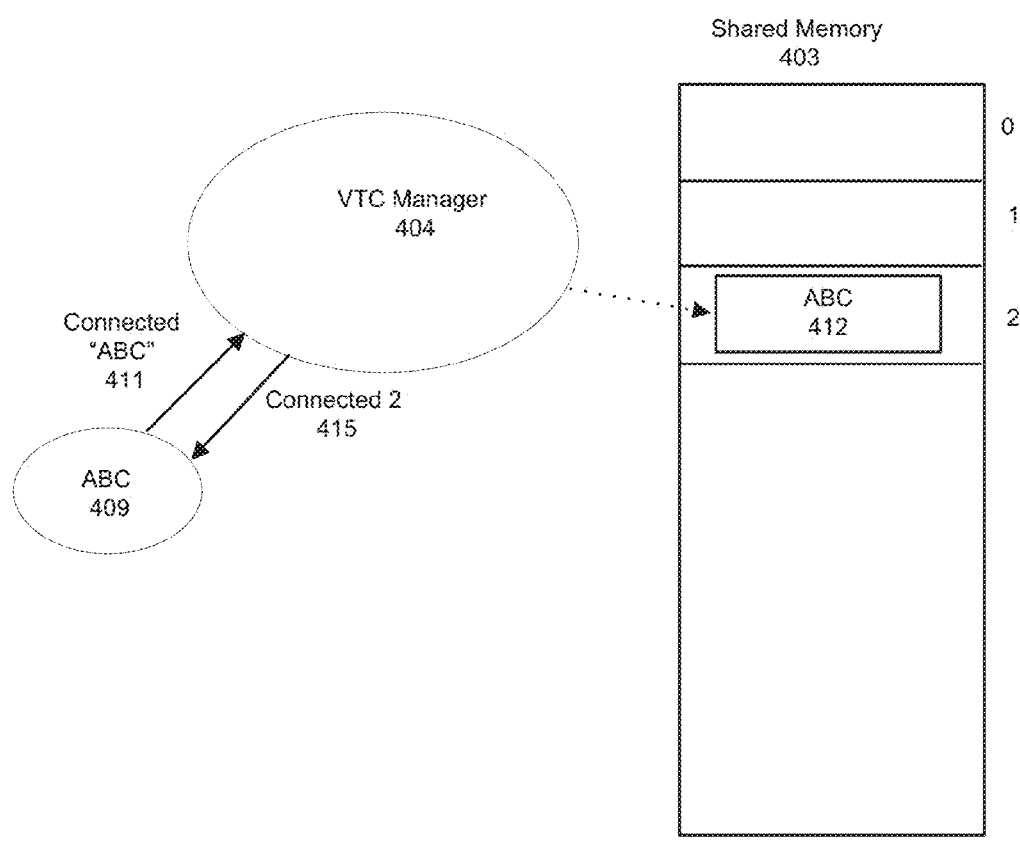
FIG. 4 illustrates the manner in which a process connects with the VTC framework in accordance with an embodiment of the present invention.

FIG. 4 illustrates the manner in which a process connects with the VTC framework in accordance with an embodiment of the present invention. In one embodiment, when a process attempts to become part of the VTC framework it performs a dynamic "connect" operation. Connecting to the VTC framework is important because it allows the components to be able to receive events and also to send and receive commands. In one embodiment, in order to register, a component has to provide a unique string identifier, e.g., "ABC" as well as any event or command callbacks to the VTC manager 404 through pathway 411.

In one embodiment, the VTC manager 404, after receiving the connect request, will find a segment in shared memory 403 to dedicate to ABC component 409. Other components can then access component 409 through its entry in shared memory 403. The entry within shared memory is pre-allocated and comprises a static number of bytes. Allocating a static number of bytes in the shared memory for each component allows the VTC framework to be platform independent because components from both 32 bit architectures and 64 bit architectures can have entries within the shared memory 403. In one embodiment, after allocating an entry within shared memory, e.g., segment 2 as shown in FIG. 4, the VTC manager 404 will return a pointer to the corresponding segment within the memory back to the connecting component through pathway 415. Both VTC Manager 404 and connecting component 409 will have access to pointers to access entry 412 stored in segment 2 of shared memory 403.

Once connected, in one embodiment, a component may receive events and commands from other components as well as post events and issue commands. A disconnect can be performed automatically on process exit. If the process terminates abnormally, the VTC Manager 404 will detect its non-existence and clean up after it.

In one embodiment, a component within the VTC framework may be started from the command line without any special environment setup. In another embodiment, a component may also be started from a developer's script or from another application. The only requirements for a component to run in the VTC framework is to connect with the VTC framework as illustrated in FIG. 4. In one embodiment, the component may also be terminated manually, via a script or by another application and will be disconnected from the VTC framework automatically. In one embodiment, a connected component will be killed if it is still running when the VTC Manager 404 exits.

Figure 5:
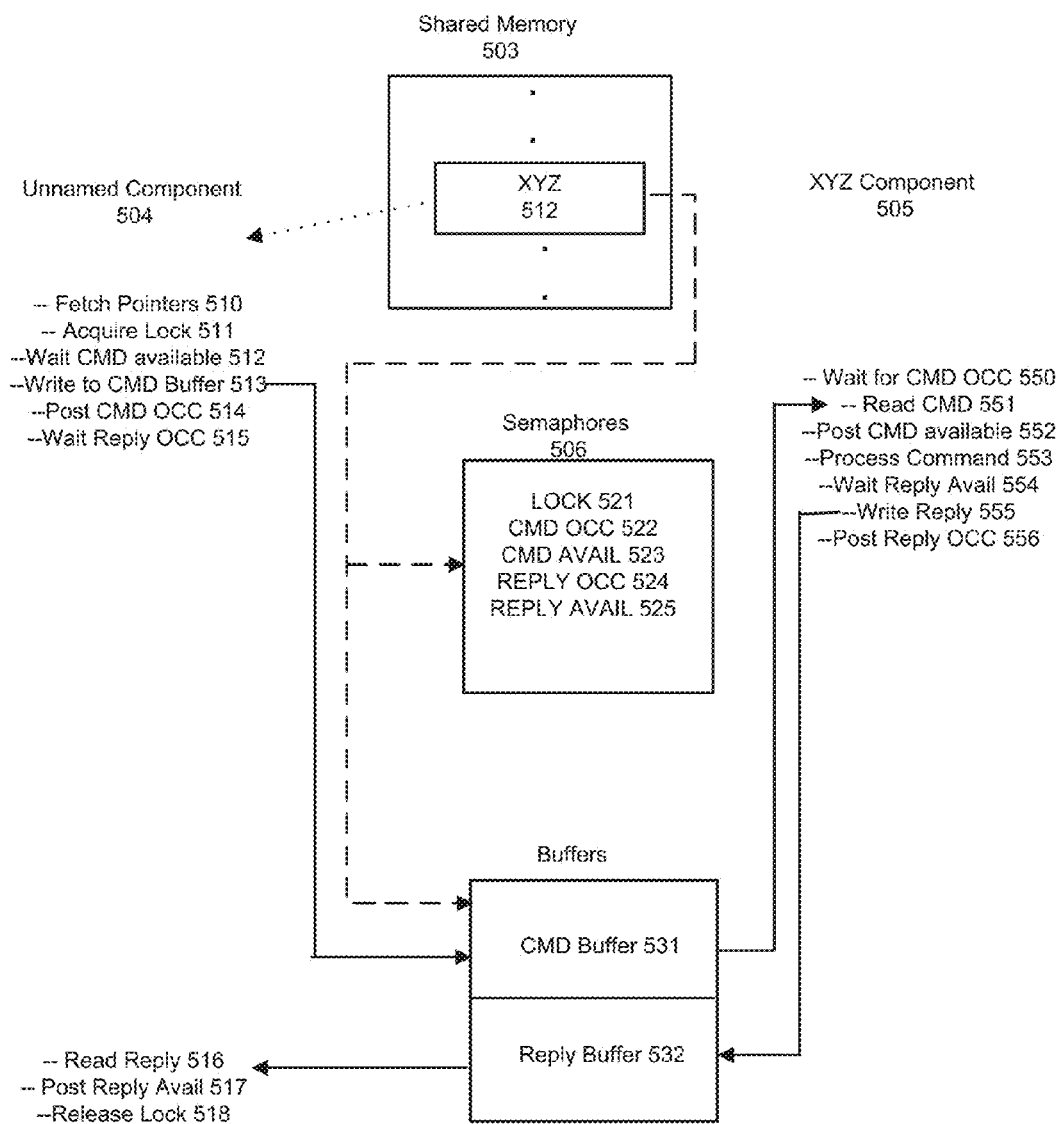
FIG. 5 illustrates the manner in which commands are exchanged between connected components in accordance with an embodiment of the present invention.

FIG. 5 illustrates the manner in which commands are exchanged between connected components in accordance with an embodiment of the present invention. Embodiments of the present invention are implemented using architecture independent shared memory structures and common semaphore synchronization patterns. Components can communicate directly to one another instead of routing through a central service.

In one embodiment, a connected component with a registered command handler may receive commands from other components. Command inputs can, in one embodiment, be key/value pairs. The recipient component may return values through key/value pairs. As will be further discussed below, in one embodiment, the caller is blocked until the command handler returns. If the component terminates (abnormally or otherwise) before returning, a timeout will occur and the caller will get an error message as a return value.

As shown in FIG. 4, when a component connects, it can register with a string identifier. In one embodiment, a transmitting component can then send commands to a target component using the string identifier that the target component is registered with. If the target is not connected, the caller will get an error message return value.

For example, when unnamed component 504, shown in FIG. 5, needs to send a command to XYZ component 505, it first fetches pointers to XYZ component 512 stored in shared memory 503. XYZ component, for example, could be associated with the yield display and the unnamed component 504 may need to send a command to the XYZ component 512 to close the yield display. Once the pointers are fetched at step 510, unnamed component 504 acquires a lock at step 511 to be able to initiate the transaction. Acquiring a lock enables the buffers of component XYZ to be locked so that no other component can send a command to it while it is transacting with unnamed component 504. This allows the command interface of the present invention to be synchronous. Access to the command buffers of each component is serialized accordingly so that only one component can communicate command-related information with a recipient component at any given time.

In order to implement this synchronous command interface, in one embodiment, the present invention uses semaphores 506. As one of ordinary skill in the art would understand, a semaphore is an abstract data type in operating systems that is used for controlling access by multiple processes to a common resource, thereby, avoiding race conditions and other pitfalls associated with concurrent operations. Semaphores 506 register the lock acquired by unnamed component as lock 521.

Subsequently, unnamed component 504 initiates a wait by signaling to the semaphore module 506 that a command is available at step 512 using the corresponding semaphore ID. The unnamed component can then write to the command buffer 531 at step 513 and post a Command Occupied status 514 to semaphore 506 to indicate that the command buffer is now occupied. In response, the semaphore module 506 can update its status to Command Occupied 522 and signal to XYZ component 505 to wait for the command at step 550. Semaphore module 506 facilitates the synchronous command handshake by tracking the status of the command, e.g., Command Occupied 522 and the Command Available 523. During the Command Occupied 522 state, XYZ component will wait to read the command at step 550 until semaphore module 506 signals the Command Available state 523. Once unnamed component 504 writes the command to command buffer 531, and semaphore 506 indicates that the command is available (using Command Available state 523), XYZ component can read the command at step 551 from command buffer 531.

The XYZ recipient component 505, at step 552, can reset the semaphore after receiving the command and post that it is available to receive another command at step 552. Subsequently, at step 553, it processes the command it has received and then signals to semaphore 506 that a reply is available at step 554. When the reply is available, at step 555, the XYZ component writes the reply into the reply buffer 532. It then signals a Reply Occupied status at step 556 and the semaphore module 506 updates its status to Reply Occupied 524 indicating that the reply buffer 532 is now occupied. In accordance with semaphore status 524, unnamed component 504 waits for the reply at step 515.

When the reply is available, unnamed component 504 reads the reply at step 516 from reply buffer 532. At step 517, unnamed component 504 can signal to the semaphore that the reply buffer 532 is now available, and accordingly, semaphore 506 updates its state to Reply Available 525. Once the transaction has finished, at step 518, unnamed component 504 can finally release the lock it acquired at step 511.

The synchronized transaction of commands and data using shared memory and semaphores are advantageous because information can be exchanged without transferring large chunks of data. For example, data is traded between unnamed component 504 and XYZ component 505 simply by exchanging pointers rather than marshaling large chunks of data around memory. Further, as mentioned above, the shared memory scheme illustrated in FIGS. 4 and 5 allows components of different architectures, e.g., both 32 bit and 64 bit architectures to communicate seamlessly.

Figure 6:
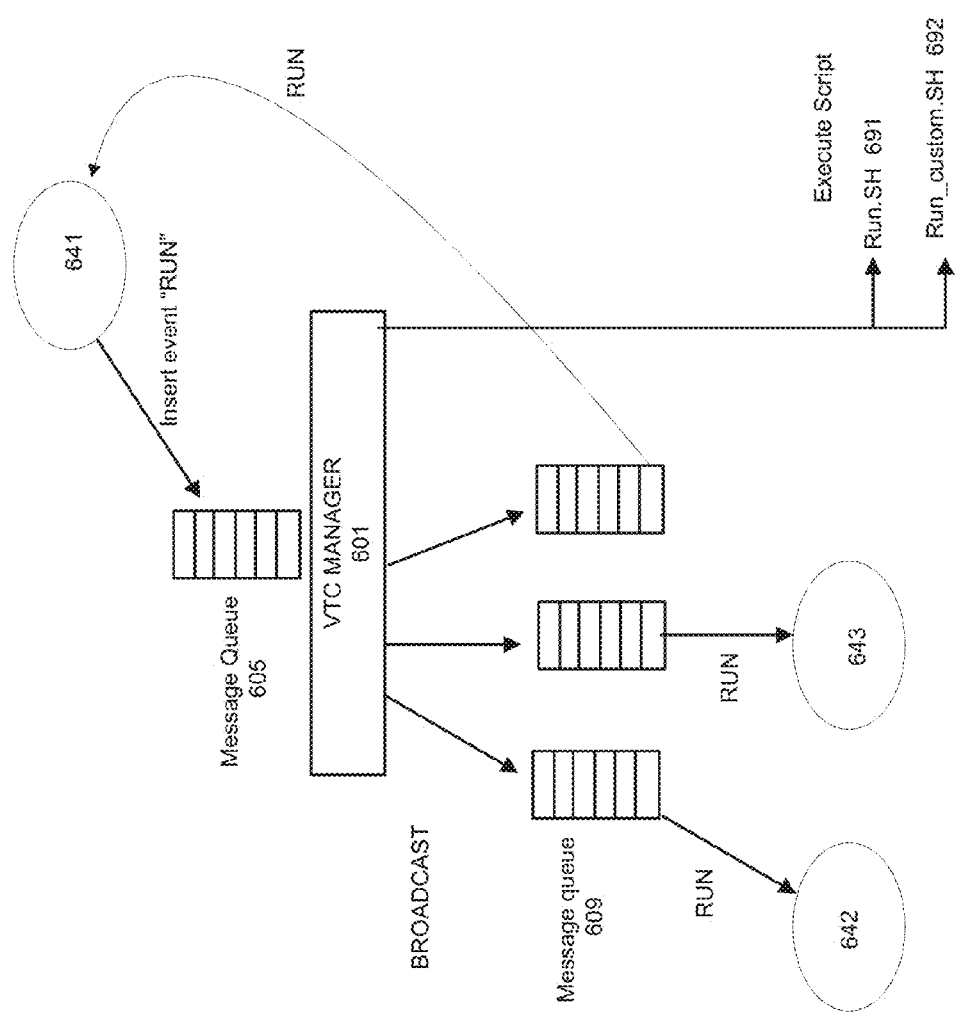
FIG. 6 illustrates the manner in which events are broadcast in the VTC framework in accordance with an embodiment of the present invention.

FIG. 6 illustrates the manner in which events are broadcast in the VTC framework in accordance with an embodiment of the present invention. Events can be used to communicate between components and to relay important messages to the components running in the framework. For example, the tester proxy server module 211 may need to communicate to all the components within the VTC framework that the handling equipment 272 is jammed or that certain sites connected with testing apparatus 271 have failed. Event notifications are implemented, in one embodiment, with message queues and buffers. As mentioned above, in contrast to command generation, event distribution is asynchronous. In other words, event notifications can be transmitted by a component without needing to account for other events also transmitting at the same time. Events are routed through a central dispatcher, e.g., VTC manager 601, which then forwards the events to all the other components in the framework.

As shown in FIG. 6, in one embodiment, when event "RUN" 641 is generated by component 641, it is inserted into the message queue 605 for VTC Manager 601. The VTC manager will look for scripts associate with event "RUN" and execute those scripts, e.g., Run.SH 691 and Run_custom.SH 692. As a result, VTC manager 601 plays a key role in managing the lifecycle of components, because all events and associated processes are processed through the VTC manager.

In one embodiment, the VTC Manager 601 will also broadcast the event to the other components in the VTC framework, e.g., component 642 and 643. The event may also be broadcasted back to the component generating the event, e.g., component 641. The broadcasted event is inserted into the respective message queue for each component, e.g., message queue 609 for component 642. In one embodiment, queue 609 can be a FIFO queue so that messages are delivered in the order that they are received to the respective component.

In one embodiment, a connected component, e.g., components 642 and 643 with a registered event handler will receive all VTC framework related events. Input parameters can be the event name and a container of key/value strings. A component may also post its own events for all other components to be aware of.

Figure 7:
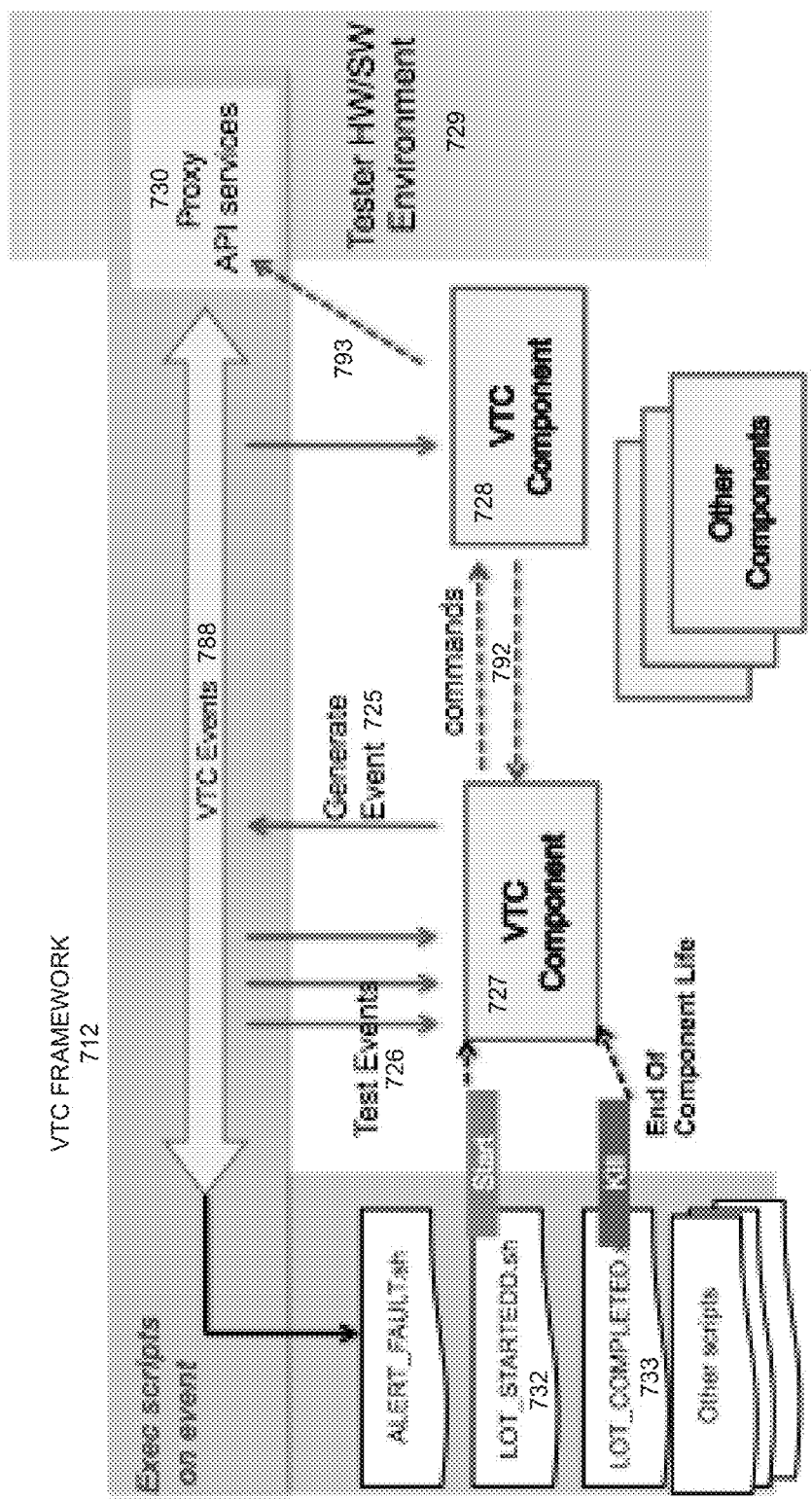
FIG. 7 is a high level diagram illustrating the manner in which commands and events are communicated between components in accordance with an embodiment of the present invention.

FIG. 7 is a high level diagram illustrating the manner in which commands and events are communicated between components in accordance with an embodiment of the present invention. As shown in FIG. 7 (and discussed previously), the VTC framework communicates to the tester software and hardware environment 729 through server proxy module 730. VTC components can, in one embodiment, communicate using commands between each other, e.g., VTC component 727 can communicate with VTC component 728 using commands 792. Further, VTC components can, in one embodiment, relay commands to the tester hardware and software environment 729 through the proxy module 730, e.g., VCT component 728 can transmit a command 793 through server proxy module 730.

In one embodiment, when an event is generated, the event can be transmitted to the VTC events bus 788 from where the VTC manager (not shown) will distributed it to other components and/or transmit it to the tester hardware and software environment 729 through proxy module 730. For example, VTC component 727 can generate an event 725, notification of which is transmitted to the event bus 788. Also VTC component 727 can receive event notifications 726 from other components in the system through event bus 788.

As also shown and discussed in FIG. 6, when an event is generated, the VTC manager can activate scripts associated with the event. For example, when an event, e.g., starting a new test lot in the tester environment 729 occurs, the notification of the event gets forwarded through proxy module 730 to the VTC framework 712. This results in a script matching the event being run, e.g., script LOT_STARTED.sh 732 is run from within the VTC framework 712. When the lot is finished, another event is generated and the corresponding script, e.g., LOT_COMPLETED.sh 733 is executed. By executing scripts associated with events, the VTC manager of the VTC framework 712 can create components with a lifecycle.

Figure 8:
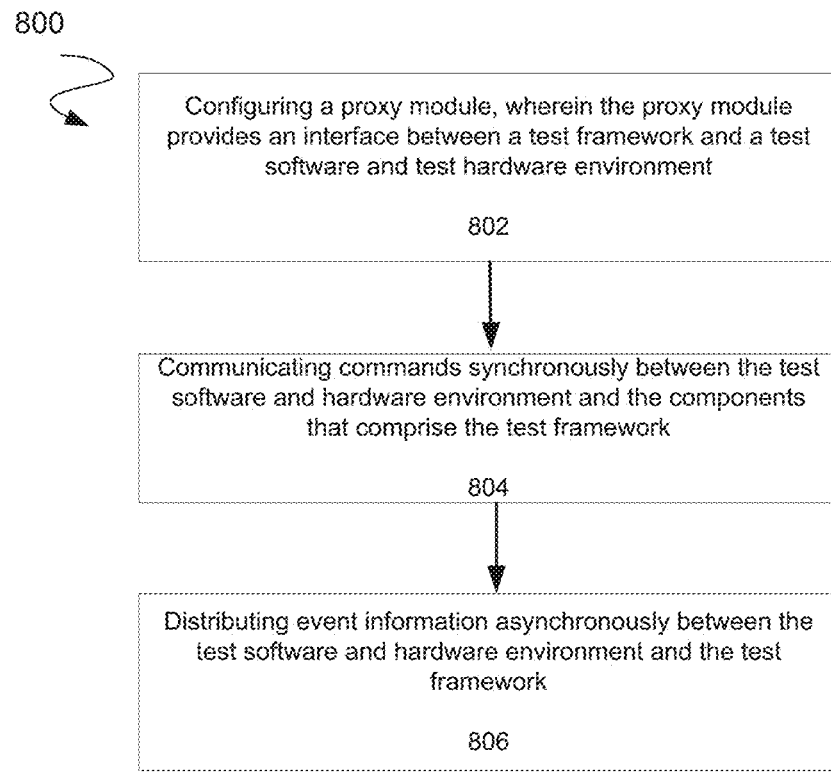
FIG. 8 depicts a flowchart of an exemplary process of performing a test using automated test equipment in accordance with an embodiment of the present invention.

FIG. 8 depicts a flowchart 800 of an exemplary process of performing a test using automated test equipment (ATE) in accordance with an embodiment of the present invention. The present invention, however, is not limited to the description provided by flowchart 800. Rather, it will be apparent to persons skilled in the relevant art(s) from the teachings provided herein that other functional flows are within the scope and spirit of the present invention.

At step 802, a proxy server module 730 is configured to interface between a test framework (e.g., the VTC framework 712) and a tester hardware and software environment 729. As explained above, the VTC framework 212 provides a layer of abstraction over the tester software 281, which allows it to operate over a wide range of test software versions.

At step 804, commands are communicated synchronously between the components comprising the test framework and the test software environment. As indicated above, the commands are synchronous, so that when one command is initiated all other commands are blocked until the receiving application or component responds. In one embodiment, inter-component commands can also be implemented using architecture independent shared memory structures and common semaphore synchronization patterns.

At step 806, events are distributed asynchronously between the test software and hardware environment and the test framework. As also discussed above, in contrast to commands, event notifications and distribution among components are asynchronous. In other words, a component may simply post an event to the event bus 214 without needing to wait for any other components. The events will then be distributed by the central dispatcher to the other components through event bus 214.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method of performing a test using automated test equipment (ATE), the method comprising:
    configuring a proxy application programming interface (API) services module, wherein the proxy API services module provides an interface between a test framework and a test software environment, wherein said test framework communicates with said test software environment through said proxy API services module, wherein said test software environment is communicatively coupled with test hardware, and wherein further said proxy API services module is configured to isolate said test framework from dependencies associated with said test software environment; and
    communicating commands synchronously between said test framework and said test software environment, wherein said test framework comprises a plurality of components that is operable to receive commands from said test software environment and further operable to transmit commands to said test software environment through said proxy API services module.

2. The method of claim 1, wherein said communicating further comprises:
    communicating commands synchronously between components within said test framework using shared memory structures and common semaphore synchronization patterns.

3. The method of claim 1, further comprising:
    distributing event notifications asynchronously between said test framework and said test software environment, wherein said event information is distributed through a central dispatcher module.

4. The method of claim 3, wherein said test framework and said test software environment are implemented on a test cell controller, and wherein said central dispatcher module is a daemon process running on said test cell controller.

5. The method of claim 3, further comprising:
    distributing event notifications from a component in said test framework to other components in said test framework through said central dispatcher, wherein said central dispatcher is operable to insert an event notification to be distributed into a message queue associated with each component within said test framework.

6. The method of claim 1, further comprising:
    creating a component within said test framework; and
    connecting to said test framework using a unique string identifier.

7. The method of claim 6, further comprising:
    generating an event from said component; and
    initiating execution of a script associated with said event using a central dispatcher module.

8. An apparatus for testing a device, the apparatus comprising:
    a memory; and
    a processor configured to implement:
        a test framework comprising a plurality of components, wherein each component is a process and wherein a respective lifecycle of each component is determined by said test framework; and
        a proxy application programming interface (API) service module operable to provide an interface between said test framework and a test software environment, wherein said test framework communicates with said test software environment through said proxy API services module, wherein said test software environment is communicatively coupled with test hardware, and wherein further said proxy API services module is configured to isolate said test framework from dependencies associated with said test software environment, and wherein said proxy API service module is further operable to communicate commands synchronously between said test framework and said test software environment, wherein said plurality of components is operable to receive commands from said test software environment and further operable to transmit commands to said test software environment through said proxy API services module.

9. The apparatus of claim 8, wherein each of said plurality of components is operable to communicate commands synchronously to other components within said test framework using shared memory structures and common semaphore synchronization patterns.

10. The apparatus of claim 8, further comprising:
a central dispatcher module operable to route event notifications asynchronously between said test software environment and said plurality of components within said test framework.

11. The apparatus of claim 10, further comprising:
a test cell controller, wherein said test framework and said test software environment are implemented on said test cell controller, and wherein said central dispatcher module is a daemon process running on said test cell controller.

12. The apparatus of claim 10, wherein said central dispatcher module is further operable to route event notifications from a component in said test framework to other components in said test framework, and wherein said central dispatcher inserts an event notification to be distributed into a message queue associated with each component within said test framework.

13. The apparatus of claim 8, wherein each component is selected from a group consisting of: a 32-bit architecture component and a 64-bit architecture component.

14. A non-transitory computer-readable medium having computer-readable program code embodied therein for causing a computer system to perform a method of configuring a test using automated test equipment (ATE), the method comprising:
configuring a proxy application programming interface (API) services module to provide an interface between a test framework and a test software environment, wherein said test framework communicates with said test software environment through said proxy API services module, wherein said test software environment is communicatively coupled with test hardware, and wherein said proxy API services module is also configured to isolate said test framework from dependencies associated with said test software environment; and
communicating commands synchronously between said test framework and said test software environment, wherein said test framework comprises a plurality of components operable to receive commands from said test software environment and further operable to transmit commands to said test software environment through said proxy API services module.

15. The non-transitory computer-readable medium of claim 14, wherein the communicating further comprises:
communicating commands synchronously between components within said test framework using shared memory structures and common semaphore synchronization patterns.

16. The non-transitory computer-readable medium of claim 14, wherein the method further comprises:
distributing event notifications asynchronously between said test framework and said test software environment, wherein said event information is distributed through a central dispatcher module.

17. The non-transitory computer-readable medium of claim 16, wherein said test framework and said test software environment are implemented on a test cell controller, and wherein said central dispatcher module is a daemon process running on said test cell controller.

18. The non-transitory computer-readable medium of claim 16, wherein said method further comprises:
distributing event notifications from a component in said test framework to other components in said test framework through said central dispatcher, wherein said central dispatcher is operable to insert an event notification to be distributed into a message queue associated with each component within said test framework.

19. The non-transitory computer-readable medium of claim 14, wherein the method further comprises:
creating a component within said test framework; and
connecting to said test framework using a unique string identifier.

20. The non-transitory computer-readable medium of claim 14, wherein the method further comprises:
generating an event from said component; and
initiating execution of a script associated with said event using a central dispatcher module.

* * * * *